United States Patent
Rizvi et al.

(10) Patent No.: US 11,075,624 B2
(45) Date of Patent: Jul. 27, 2021

(54) HYBRID DRIVER HAVING LOW OUTPUT PAD CAPACITANCE

(71) Applicant: STMicroelectronics International N.V., Geneva (CH)

(72) Inventors: Saiyid Mohammad Irshad Rizvi, New Delhi (IN); Manish Garg, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/906,664

(22) Filed: Jun. 19, 2020

(65) Prior Publication Data

US 2020/0412357 A1 Dec. 31, 2020

Related U.S. Application Data

(60) Provisional application No. 62/866,230, filed on Jun. 25, 2019.

(51) Int. Cl.
*H03K 19/0185* (2006.01)
*H03K 17/16* (2006.01)
*H03K 19/20* (2006.01)
*H03K 19/0175* (2006.01)

(52) U.S. Cl.
CPC ....... *H03K 17/161* (2013.01); *H03K 19/0175* (2013.01); *H03K 19/20* (2013.01)

(58) Field of Classification Search
CPC ............. H03K 17/161; H03K 19/0175; H03K 19/0185; H03K 19/018507; H03K 19/018521; H03K 19/01; H03K 19/017; H03K 19/01721; H03K 19/20; H03K 2217/0081; H03K 2217/009
See application file for complete search history.

(56) References Cited

U.S. PATENT DOCUMENTS

| | | | |
|---|---|---|---|
| 6,831,480 B1 | 12/2004 | Shumarayev et al. | |
| 6,856,178 B1 | 2/2005 | Narayan | |
| 9,009,379 B1 | 4/2015 | Marena et al. | |
| 10,079,603 B1 | 9/2018 | Panigrahi | |
| 10,560,099 B1 * | 2/2020 | Hong | H03K 19/018521 |
| 2005/0104619 A1 | 5/2005 | Best et al. | |

FOREIGN PATENT DOCUMENTS

EP    1 742 363 A2    1/2007

* cited by examiner

*Primary Examiner* — Long Nguyen
(74) *Attorney, Agent, or Firm* — Seed IP Law Group LLP

(57) ABSTRACT

A hybrid driver receives complementary high-speed input data signals and a pair of low-speed input data signals and selects one of the pairs of input data signals and drives output data signals on first and second output nodes based on the selected pair of input data signals. The hybrid driver includes first and second driver circuits coupled to the first and second output nodes, respectively. Each driver circuit includes first and second series-connected transistors coupled between a first supply voltage node and a reference voltage node, with an interconnection of the first and second series-connected transistors coupled to the corresponding first or second output node. Each first and second driver circuit includes a third transistor coupled in parallel with the corresponding first transistor. Each first and third transistor couples in parallel the corresponding output node to a second supply voltage node responsive to the corresponding low-speed input data signal.

20 Claims, 3 Drawing Sheets

US 11,075,624 B2

HYBRID DRIVER HAVING LOW OUTPUT PAD CAPACITANCE

BACKGROUND

Technical Field

The present application is directed generally to output drivers, and more specifically to a hybrid transmitter or driver having a reduced output pad capacitance for providing low-speed signals and high-speed differential signals.

Description of the Related Art

A conventional hybrid driver includes high-speed differential signaling circuitry for providing, in a high-speed mode of operation, high-speed differential signals, such as scalable low voltage signals (SLVS). These high-speed differential signals are provided on a pair of output pads. The hybrid driver also includes low-speed signaling circuitry coupled these output pads. In a low-speed mode of operation, the low-speed signaling circuitry provides on the output pads low-speed signals such as low voltage complementary metal oxide semiconductor (LVCMOS) signals. Hybrid drivers providing this type of dual signaling functionality are required in various communication standards, such as the embedded universal serial bus (eUSB) specification or standard, which requires the driver provide both low speed low voltage signals such as LVCMOS signals along with high speed differential signal such as SLVS signals. As a result, the driver must include both LVCMOS and SLVS circuitry coupled in parallel to drive the output pads in the high- and low-speed modes of operation. This combination of SLVS and LVCMOS circuitry coupled in parallel to the output pads increases the capacitance of each of these output pads, which adversely affects the performance of the hybrid driver 100 in the high-speed mode of operation because the SLVS circuitry is very sensitive to changes in the capacitances of the output pad. There is accordingly a need for improved hybrid drivers.

BRIEF SUMMARY

Embodiments of the present disclosure are directed to hybrid transmitters or drivers for communicating signals over various standards, such as eUSB, which require both low speed low voltage CMOS (LVCMOS) signaling along with high speed differential signaling such as scalable low voltage signaling (SLVS). Instead of simply using LVCMOS and SLVS circuitry coupled in parallel, however, embodiments of the present disclosure utilize simplified circuitry that provides the required dual signaling functionality while reducing the capacitance of the output pads of the driver on which these signals are provided. This reduced capacitance improves the high-speed operation of the SLVS circuitry of the hybrid driver.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

Figure 1:
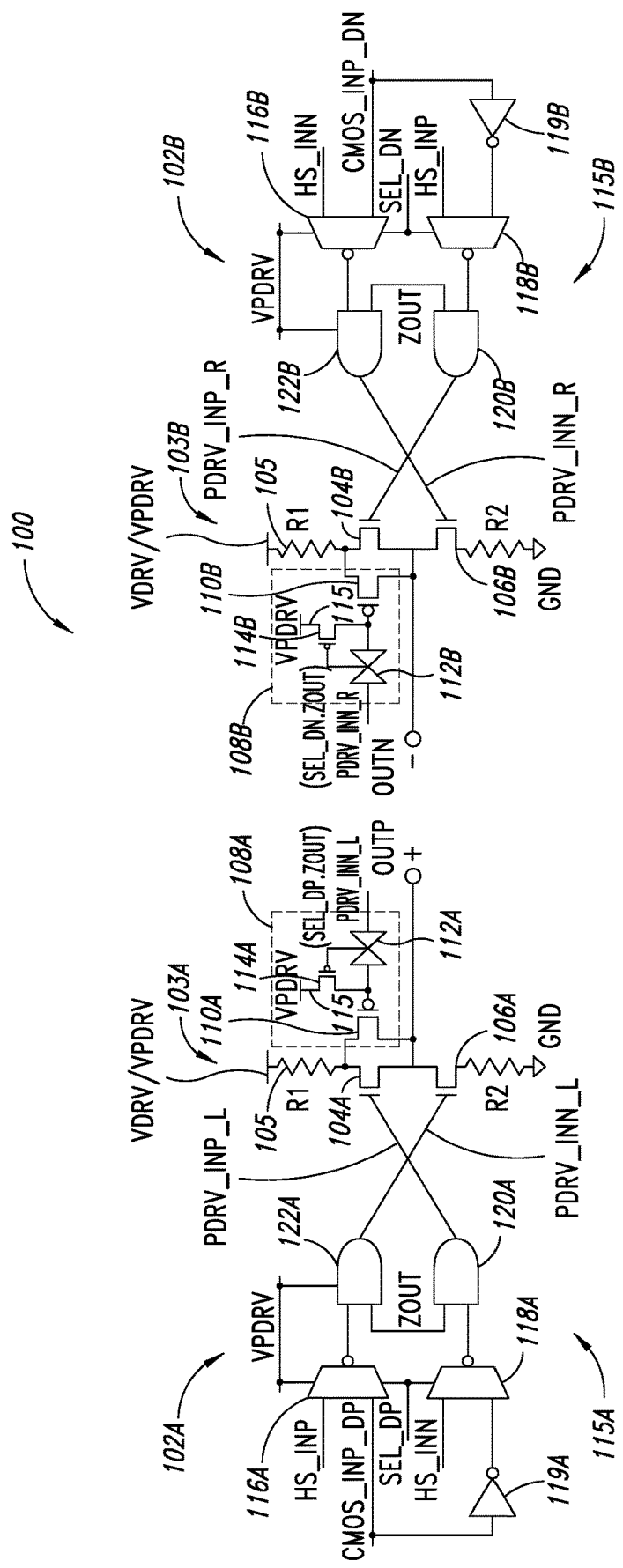
FIG. 1 is schematic of a hybrid driver having a reduced output pad capacitance for providing high-speed and low-speed signals according to a first embodiment of the present disclosure.

FIG. 1 is schematic of a hybrid driver 100 having reduced capacitances on output pads OUTP, OUTN for providing high-speed differential output signals and low-speed output signals according to a first embodiment of the present disclosure. Instead of merely coupling high-speed and low-speed driver circuitry in parallel to these output pads OUTP, OUTN as in conventional hybrid drivers, the hybrid driver 100 according to embodiments of the present disclosure includes simplified circuitry provides the required dual-signaling functionality but reduces the capacitance at each of the output pads OUTP, OUTN and thus improves the high-speed operation of the hybrid driver, as will be described in more detail below.

In the present description, certain details are set forth in conjunction with the described embodiments to provide a sufficient understanding of the present disclosure. One skilled in the art will appreciate, however, that embodiments of the disclosure may be practiced without these particular details. Furthermore, one skilled in the art will appreciate that the present disclosure is not limited to the example embodiments described herein, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail below to avoid unnecessarily obscuring the present disclosure. Finally, components that are common among the described embodiments are given the same reference numbers or descriptors in the present application even though the detailed operation of such components may vary among embodiments.

As used herein the terms "high-speed" and "low-speed" are used in relation to a data rate of the associated signal. The high-speed differential signals discussed herein accordingly have a data transmission rate that is greater than a data transmission rate of the low-speed signals. For example, the high-speed differential signals may be signals communicated according to low voltage differential signaling (LVDS), such as scalable low voltage signaling (SLVS), where such signals may have a data transmission rate of 6 gigabits per second (Gps), for example. The low-speed signals herein may, for example, be low voltage complementary metal oxide semiconductor (LVCMOS) signaling having a data transmission rate of 12 megabits per second (Mbps), for example. These types of signaling for the high-speed differential signals and low-speed signals are merely examples, and these signals are not limited these specific types of signaling in embodiments of the present disclosure.

In operation in the high-speed mode, the hybrid driver 100 receives high-speed differential input data signals HS_INP, HS_INN and drives corresponding high-speed differential output data signals on the output pads OUTP, OUTN. The high-speed differential input signals HS_INP, HS_INN and output signals are complementary signals, as will be appreciated by those skilled in the art. In operation in the low-speed mode, the hybrid driver 100 receives independent low-speed data input signals CMOS_INP_DP, CMOS_INP_DN and drives corresponding low-speed data output signals on the output pads OUTP, OUTN. The CMOS_INP_DP, CMOS_INP_DN signals may be independently selected in the low-speed mode, as will be explained in more detail below.

The hybrid driver 100 includes two driver circuits 102A, 1026, where the driver circuit 102A receives the high-speed differential input signals HS_INP, HS_INN and the low-speed data input signal CMOS_INP_DP and drives the output pad OUTP in response to these signals. Similarly, the driver circuit 102B receives the high-speed differential input signals HS_INP, HS_INN and the low-speed data input signal CMOS_INP_DN and drives the output pad OUTN in response to these signals. Each driver circuit 102A, 102B includes a high-speed differential driver circuit 103A, 1036 including a first transistor 104A, 1046 coupled is series with a first resistor R1 between a first supply voltage node 105 which receives a first supply voltage VDRV or second supply voltage VPDRV, and the corresponding output node OUTP, OUTN. The first supply voltage node receiving either supply voltage VDRV or VPDRV is presented as VDRV/VPDRV in FIG. 1. A second transistor 106A, 1066 is coupled I series with a second resistor R2 between the output node OUTP, OUTN and a reference voltage node receiving a reference voltage GND in the embodiment of FIG. 1. The supply voltage VDRV/VPDRV depends on the mode of operation of the hybrid driver 100. In the high-speed mode of operation, the first supply voltage node receives the first supply voltage VDRV, which has a value of 400 millivolts (mv) in one embodiment. The first supply voltage node receives the second supply voltage VPDRV in the low-speed mode of operation, where the voltage VPDRV has a value of 1.2 volts in one embodiment. The first and second transistors 104A, 104B, 106A, 106B are NMOS transistors in the embodiment of FIG. 1.

Each driver circuit 102A, 1026 further includes a low-speed driver circuit 108A, 1086, where each low-speed driver circuit has a third transistor 110A, 110B coupled in parallel with the corresponding first transistor 104A, 104B. The third transistor 110A, 110B is a PMOS transistor in the embodiment of FIG. 1. This single third transistor 110A, 110B is the only additional component coupled to the output nodes OUTP, OUTN to provide the hybrid driver 100 with the low-speed mode of operation functionality. The single third transistor 110A, 110B does not add much capacitance to the each output node OUTP, OUTN and thereby improves the operation the hybrid driver 100 in the high-speed mode of operation. Conventional hybrid drivers couple an output of a separate low-speed driver to each output node OUTP, OUTN to drive these nodes in the low-speed mode of operation. These conventional drivers include multiple components coupled to each output pad OUTP, OUTN and these multiple components add capacitance to the output nodes OUTP, OUTN that can be significant at the data transfer rates required for the high-speed differential signals communicated by the hybrid driver 100.

Each low-speed driver circuit 108A, 108B further includes a pass gate 112A, 112B having an output node coupled to a control node of the corresponding third transistor 110A, 110B and an input node coupled to receive a corresponding drive control signal PDRV_INN_L, PDRV_INN_R. A control node of each pass gate 112A, 1126 receives a corresponding selection signal SEL_DP.ZOUT, SEL_DN.ZOUT to control activation and deactivation of the pass gate. As will be appreciated by those skilled in the art, in response to the selection signal SEL_DP.ZOUT, SEL_DN.ZOUT activating the corresponding pass gate 112A, 1126, the pass gate couples the corresponding input and output nodes together. Each pass gate 112A, 1126 isolates the corresponding input and output nodes responsive to the selection signal SEL_DP.ZOUT, SEL_DN.ZOUT deactivating the pass gate.

The low-speed driver circuits 108A, 108B each further include a fourth transistor 114A, 114B coupled between a second supply voltage node 115 that receives the second supply voltage VPDRV and the control node of the third transistor 110A, 110B. The fourth transistor 114A, 114B is a PMOS transistor in the embodiment of FIG. 1. Each fourth transistor 114A, 114B receives the corresponding selection signal SEL_DP.ZOUT, SEL_DN.ZOUT on a control node and functions to turn OFF the third transistor when the pass gate 112A, 112B is deactivated. More specifically, in the embodiment of FIG. 1, when the selection signal SEL_DP.ZOUT, SEL_DN.ZOUT is low, the pass gates 112A, 112B are turned OFF, isolating the corresponding drive control signal PDRV_INN_L, PDRV_INN_R from the third transistors 110A, 110B. Without the fourth transistors 114A, 114B, the control nodes of the third transistors 110A, 110B would be floating in this situation when the pass gate 112A, 112B is turned OFF. In this situation, the low selection signal SEL_DP.ZOUT, SEL_DN.ZOUT turns ON the corresponding fourth transistor 114A, 114B, driving the control node of the corresponding third transistor 110A, 110B to approximately the second supply voltage VPDRV and thereby turning OFF the third transistor.

Each driver circuit 102A, 1026 also includes a corresponding logic circuit 115A, 1156 coupled to the high-speed differential driver circuit 103A, 1036 and the low-speed driver circuit 108A, 108B. Each logic circuit 115A, 1156 receives the first and second high-speed differential input signals HS_INP, HS_INN and also receives a corresponding one of the low-speed input signals CMOS_INP_DP, CMOS_INP_DN. A mode selection signal SEL_DP, SEL_DN is applied to each logic circuit 115A, 1156 and has a value indicating either the high-speed or low-speed mode of operation. Each logic circuit 115A, 1156 also receives an enable signal ZOUT to disable or enable the corresponding driver circuit 102A, 102B.

When the mode selection signal SEL_DP, SEL_DN indicates the high-speed mode of operation, the logic circuit 115A, 115B generates the drive control signals PDRV_INN_L, PDRV_INN_R and also generates drive control signals PDRV_INP_L, PDRV_INP_R to activate and deactivate the first transistors 104A, 104B and second transistors 106A, 106B responsive to the first and second high-speed differential input signals HS_INP, HS_INN. In this high-speed mode, the enable signal ZOUT is also active to enable the driver circuits 102A, 102B and the mode selection signal SEL_DP, SEL_DN are also active, as will be explained in more detail below. The active selection signals SEL_DP_ZOUT, SEL_DN.ZOUT turn ON the fourth transistor 114A, 114B to thereby deactivate the third transistor 110A, 110B. Thus, in this high-speed mode the logic circuit 115A, 115B generates the drive control signals PDRV_INN_L, PDRV_INN_R, PDRV_INP_L, PDRV_INP_R, to control activation and deactivation of the transistors 104A, 104B, 106A, 106B responsive to the high-speed differential input signals HS_INP, HS_INN and thereby drive the corresponding high-speed differential output signals on the output pads OUTP, OUTN.

When the mode selection signal SEL_DP, SEL_DN indicates the low-speed mode of operation, the logic circuit 115A, 115B generates the drive control signals PDRV_INN_L, PDRV_INN_R, PDRV_INP_L, PDRV_INP_R to activate and deactivate the first transistors 104A, 104B and third transistors 110A, 110B in parallel or to activate the second transistors 106A, 106B responsive to the corresponding low-speed input signal CMOS_INP_DP, CMOS_INP_DN. The level or value of each CMOS_INP_DP, CMOS_INP_DN signal determines whether the logic circuit 115A, 115B actives the corresponding second transistor 106A, 106B or the corresponding first transistor 104A, 104B and third transistor 110A, 110B in parallel, as will be described in more detail below.

In the embodiment of FIG. 1, the logic circuits 115A, 115B in the will now be described in more detail. Each of the logic circuits 115A, 115B includes a pair of inverting multiplexers 116A, 118A, 116B, 118B to select between the high-speed differential input signals HS_INP, HS_INN and the low-speed input signals CMOS_INP, CMOS_INN in response to the corresponding mode selection signal SEL_DP, SEL_DN. Each low-speed input signal CMOS_INP, CMOS_INN is applied directly to one input of the multiplexer 116A, 116B and through a corresponding inverter 119A, 119B to an input of the multiplexer 118A, 118B. In response to the SEL_DP, SEL_DN signals, the inverting multiplexers 116A, 118A and 116B, 118B provide the selected ones of the complementary input signals HS_INP, HS_INN and CMOS_INP, CMOS_INN to drive AND gates 120A, 122A and 120B, 122B which, in turn, drive the gates of the first and second transistors 104A, 106A and 104B, 106B. Each of the AND gates 120A, 120B, 122A, 122B receives the enable signal ZOUT along an output of a corresponding one of the inverting multiplexers 116A, 116B, 118A, 118B, and generates the drive control signals PDRV_INP_L, PDRV_INN_L, PDRV_INP_R and PDRV_INN_R to control the corresponding transistors 104A, 104B, 106A, 106B and 110A, 110B based on the selected input signals HS_INP, HS_INN or CMOS_INP, CMOS_INN, as will now be described in more detail below. As seen in FIG. 1, the inverting multiplexers 116A, 116B, 118A, 118B and AND gates 120A, 120B, 122A, 122B are powered by the second supply voltage VPDRV.

The operation of the driver circuit 102A will now be described in more detail in both the high-speed and low-speed modes of operation. This operation of the driver circuit 102A in generating the high-speed differential output signal on the output pad OUTP is the same as that of the driver circuit 102B in generating the complementary high-speed differential output signal on the output pad OUTN, and thus only the operation of the driver circuit 102A is described in more detail below. Similarly, in the low-speed mode of operation of the driver circuit 102B operates in the same way as the driver circuit 102A and thus only the operation of the driver circuit 102A is described in more detail below. In the low-speed mode, the input signals CMOS_INP_DP, CMOS_INP_DN are independent signals and not complementary signals as in the high-speed mode, and thus both input signals may be high, both may be low, or the signals may have different voltage levels corresponding to different logic states.

In the high-speed mode of operation of the driver circuit 102A, the mode selection signal SEL_DP is low causing the inverting multiplexers 116A, 118A to select the high-speed differential input signals HS_INP, HS_INN. The enable signal ZOUT is high to enable the AND gates 120A, 122A, and the selection signal SEL_DP.ZOUT is low to thereby turn OFF the pass gate 112A and turn ON the fourth transistor 114A, which drives the control node of the third transistor 110A high to thereby turn OFF the transistor 110A. Thus, in the high-speed mode, the first and second transistors 104A, 106A drive the output pad OUTP in response to the levels or values of the input signals HS_INP, HS_INN, as will now be described in more detail. Also in the high-speed mode of operation, the first supply voltage VDRV is provided to the first supply node 105 as previously mentioned.

In response to the low mode selection SEL_DP, the inverting multiplexers 116A, 118A select the high-speed differential input signals HS_INP, HS_INN. The multiplexers 116A and 118A provide on respective outputs the inverted input signals HS_INP and HS_INN, respectively. For the initial description of the operation of the driver circuit 102A, assume the input signals HS_INP and HS_INN are high and low, respectively. The multiplexer 116A accordingly drives its output low since the HS_INP signal is high, and the AND gate 122A receives this low output and the high ZOUT signal and accordingly drives the drive control signal PDRV_INN_L at its output low, turning OFF the transistor 106A. At the same time, the multiplexer 118A drives its output high since the HS_INN signal is low. Thus, the AND gate 120A receives the high output from the multiplexer 118A and the high ZOUT signal, and accordingly drives the drive control signal PDRV_INP_L at its output high, turning ON the transistor 104A and thereby driving the output pad OUTP high to the first supply voltage VDRV.

In the high-speed mode when the input signals HS_INP and HS_INN have the complementary levels, namely are low and high, the operation of the driver circuit 102A is as follows. The multiplexer 116A drives its output high since the HS_INP signal is low, and the AND gate 122A accordingly receives this high output and the high ZOUT signal and accordingly drives the drive control signal PDRV_INN_L at its output high, turning ON the transistor 106A and there driving the output pad OUTP to the reference voltage GND through the turned on transistor 106A. At the same time, the multiplexer 118A drives its output low since the HS_INN signal is high. Thus, the AND gate 120A receives the low output from the multiplexer 118A and the high ZOUT signal, and accordingly drives the drive control signal PDRV_INP_L at its output low, turning OFF the transistor 104A.

In the low-speed mode of operation of the driver circuit 102A, the mode selection signal SEL_DP is high causing the inverting multiplexers 116A, 118A to select the low-speed input signal CMOS_INP_DP. Assuming the drive circuit 102A is to provide a low speed output signal on the output pad OUTP, the enable signal ZOUT is again high to enable the AND gates 120A, 122A. In the low-speed mode the selection signal SEL_DP.ZOUT is now high to thereby turn ON the pass gate 112A and turn OFF the fourth transistor 114A. Accordingly, the drive control signal PDRV_INN_L is provided through the turned ON pass gate 112A to thereby control the third transistor 110A, as will be described in more detail below. As previously mentioned, in the low-speed mode the first and third transistors 104A, 110A in parallel drive the output node OUTP or the second transistor 106A drives the output pad OUTP in response to the level or value of the input signal CMOS_INP_DP, as will now be described in more detail. Also in the low-speed mode of operation, the second supply voltage VPDRV is provided to the first supply node 105 as previously mentioned.

In response to the high mode selection SEL_DP, the inverting multiplexers 116A, 118A select the low-speed input signal CMOS_INP_DP that is applied directly to multiplexer 116A and through inverter 119A to multiplexer 118A. The multiplexers 116A and 118A provide on respective outputs the corresponding inverted input signal CMOS_INP_DP and the complement thereof. For the initial description of the operation of the driver circuit 102A, assume the input signal CMOS_INP_DP is high. The multiplexer 116A accordingly drives its output low since the CMOS_INP_DP signal is high, and the AND gate 122A receives this low output and the high ZOUT signal and accordingly drives the drive control signal PDRV_INN_L at its output low, turning OFF the transistor 106A.

At the same time, the multiplexer 118A drives its output high since the CMOS_INP_DP signal is high, and this signal is inverted by inverter 119A and then again by the inverting multiplexer 118A to provide a high output from this multiplexer. Thus, the AND gate 120A receives the high output from the multiplexer 118A and the high ZOUT signal, and accordingly drives the drive control signal PDRV_INP_L at its output high, turning ON the transistor 104A. In addition, the drive control signal PDRV_INN_L from the AND gate 122A is also supplied through the turned ON pass gate 112A to drive the control node of the transistor 110A. This drive control signal PDRV_INN_L from the AND gate 122A is low and thereby turns ON the transistor 110A. Thus, when the CMOS_INP_DP signal is high, both the transistor 110A and the transistor 104A are turned ON to in parallel drive the output pad OUTP high to the second supply voltage VPDRV.

The operation of the driver circuit 102A when the input signal CMOS_INP_DP is low will now be described. In this situation, the multiplexer 116A accordingly drives its output high since the CMOS_INP_DP signal is low, and the AND gate 122A receives this high output and the high ZOUT signal and accordingly drives the drive control signal PDRV_INN_L at its output high, turning ON the transistor 106A and thereby driving the output pad OUTP to the reference voltage GND through the turned ON transistor 106A. At the same time, the multiplexer 118A drives its output low since the CMOS_INP_DP signal is low, and this signal is inverted by inverter 119A and then again by the inverting multiplexer 118A to provide a low output from this multiplexer. Thus, the AND gate 120A receives the low output from the multiplexer 118A and the high ZOUT signal, and accordingly drives the drive control signal PDRV_INP_L at its output low, turning OFF the transistor 104A. In addition, the drive control signal PDRV_INN_L from the AND gate 122A is also supplied through the turned ON pass gate 112A to drive the control node of the transistor 110A. This drive control signal PDRV_INN_L from the AND gate 122A is high in this situation and thereby turns OFF the transistor 110A. Thus, when the CMOS_INP_DP signal is low, both the transistor 110A and the transistor 104A are turned OFF and the transistor 106A is turned ON to drive the output pad OUTP low to the reference voltage GND.

The operation of the driver circuit 102A in the high-speed and low-speed modes of operation has now been described in detail. The operation of the driver circuit 102B is the same as that of driver circuit 102A and is accordingly not again described in detail. Moreover the driver circuit 102B operates in a complementary manner in the high-speed mode so the drivers 102A and 102B provide the high-speed differential signals, which are complementary signals, on the output pads OUTP, OUTN. Thus, in the high-speed mode, if the driver 102A drives the output pad OUTP high then driver 102B drives output pad OUTN low, and the converse is also true when the driver 102A drives the output pad OUTP low then driver 102B drives output pad OUTN high. In the low-speed mode of operation, the low-speed input signals CMOS_INP_DP and CMOS_INP_DN are independent and not complementary signals as previously mentioned. In this mode, the drivers 102A, 102B operate as described above for driver 102A to drive the corresponding output pad OUTP, OUTN based on the value of the corresponding received low-speed input signal CMOS_INP_DP and CMOS_INP_DN.

Figure 2:
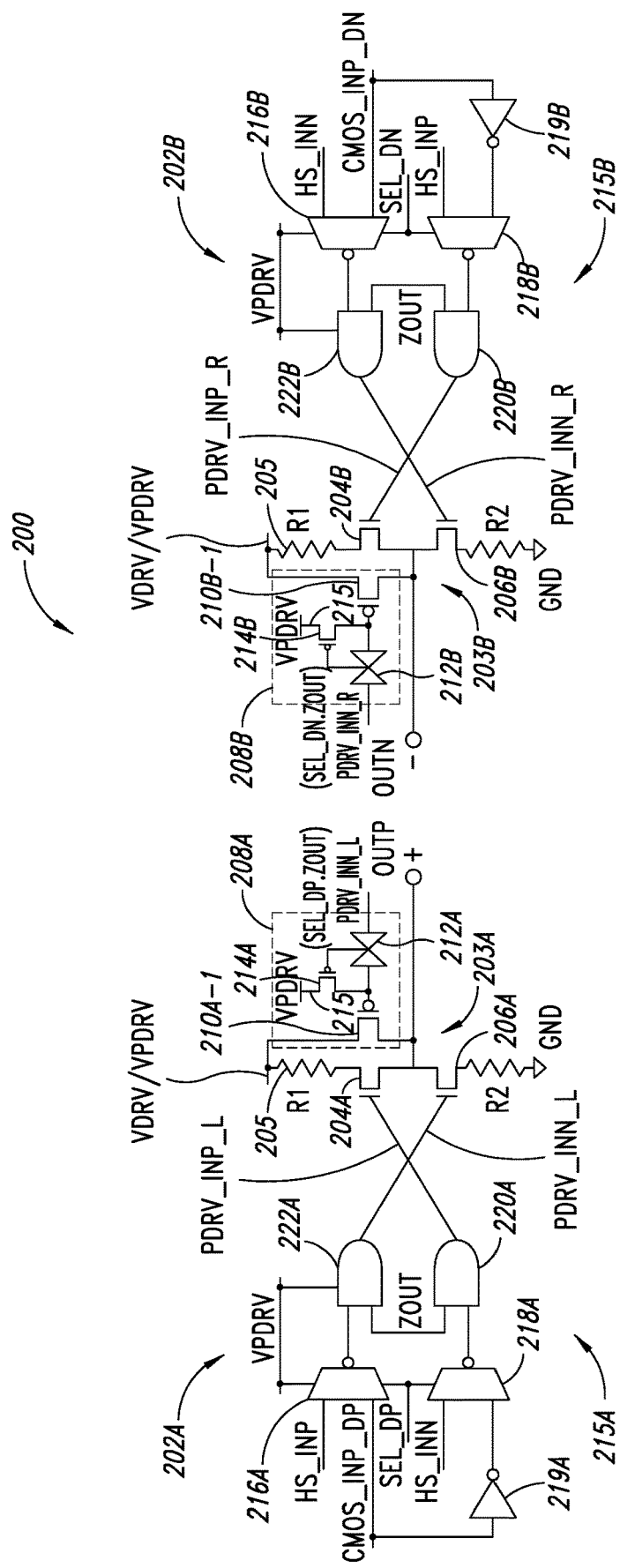
FIG. 2 is a schematic of a hybrid driver having a reduce output pad capacitance for providing high-speed and low-speed signals according to another embodiment of the present disclosure.

FIG. 2 is a schematic of a hybrid driver 200 having a reduced output pad capacitance on output pads OUTP, OUTN according to another embodiment of the present disclosure. The hybrid driver 300 is similar to the driver 100 of FIG. 1 and all components 202-218 in FIG. 2 correspond to the components 102-118 in FIG. 1, except for the PMOS transistors 210A-1, 210B-1 in the embodiment of FIG. 2. In the embodiment of FIG. 2, the PMOS transistors 210A-1, 210B-1 are coupled between the first supply voltage node 205 receiving the supply voltage VDRV/VPDRV and the output nodes OUTP, OUTN. This is in contrast to the PMOS transistors 210A, 210B of FIG. 1, which are coupled across the drive transistors 204A, 204B. The overall operation of the hybrid driver 200 as well as the individual operation of the components 202-218 is the same as the corresponding components of the hybrid driver 100 of FIG. 1, and thus, for the sake of brevity, will not again be described in detail.

Figure 3:
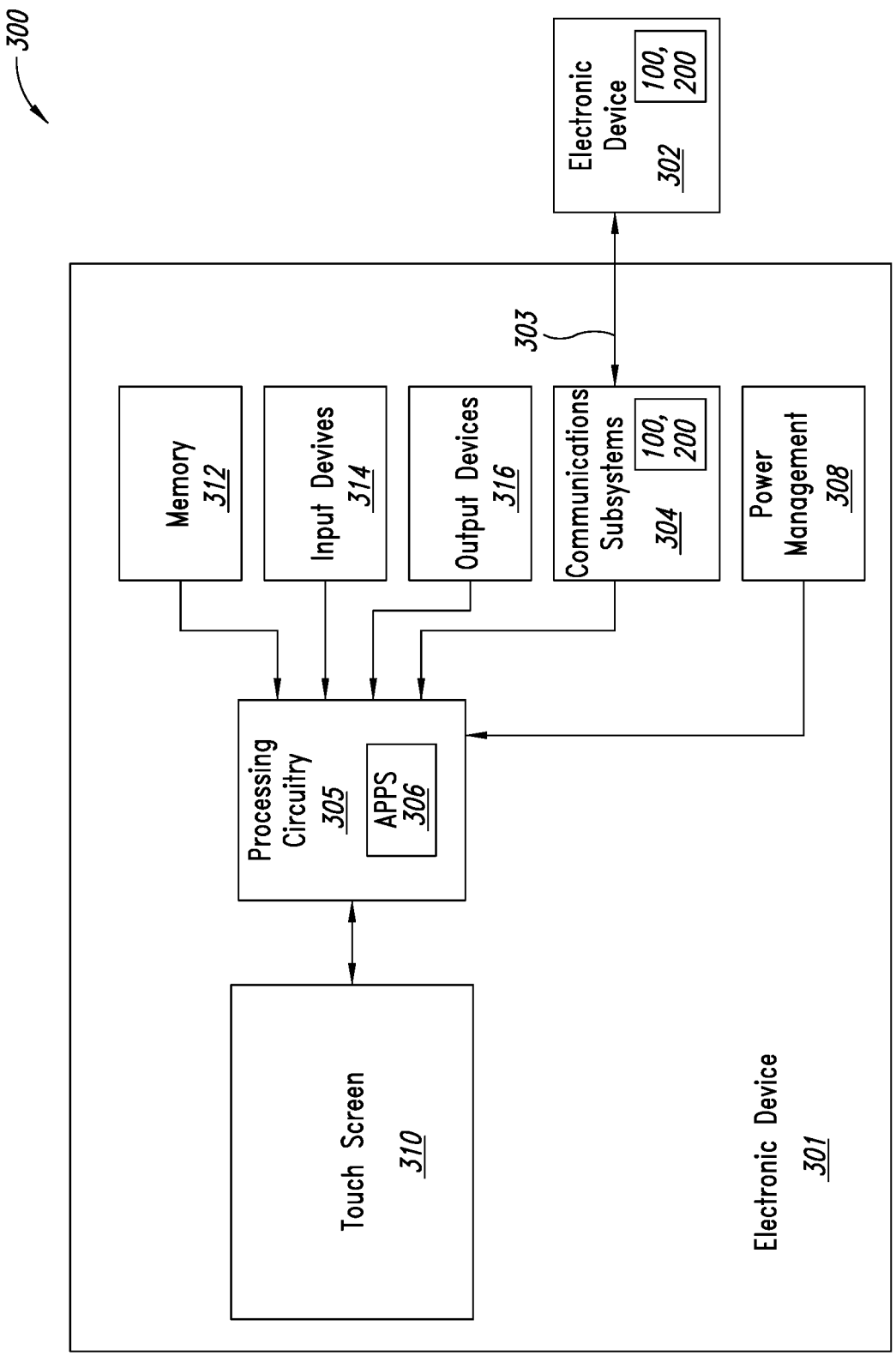
FIG. 3 is a functional block diagram of an electronic system including electronic devices including one or more of the hybrid drivers of FIGS. 1 and 2 according to an embodiment of the present disclosure.

FIG. 3 is a functional block diagram of an electronic system 300 including electronic devices 301 and 302, each electronic device including one or more of the hybrid drivers 100, 200 of FIGS. 1 and 2 according to an embodiment of the present disclosure. The electronic devices 301, 302 are coupled through a communications link 303, which is an embedded universal serial bus (eUSB) communications link in one embodiment. In this embodiment, the hybrid drivers 100, 200 drive either high-speed differential output signals or low-speed output signal over the eUSB communications link 303 during a handshake process between the electronic devices 301, 302. More specifically, the handshake process according to the eUSB standard is initiated upon a USB cable being physically connected between the two electronic devices 301, 302. This handshake process exchanges information between the electronic devices 301, 302 to determine the capabilities of the two devices, and determines the signaling parameters of the high-speed differential output signals that the hybrid drivers 100, 200 generate on the output pads OUTP, OUTN for communication over the eUSB communications link 303 to an eUSB receiver (not separately show in FIG. 3) in the other electronic device. In the electronic device 301, communications subsystems 304 include the hybrid drivers 100, 200 and would also include USB receiver for receiving signals over the USB communications link 303 from the hybrid drivers 100, 200 in the electronic device 302.

The eUSB standard is used by way of example in the electronic system 300 of FIG. 3 in relation to the hybrid drivers 100, 200 contained in the electronic devices 301, 302. Embodiments of the hybrid drivers 100, 200 are not limited to being used in the eUSB standard, and in other embodiments of the present disclosure the hybrid drivers described herein are used to generate output data signals for communicating according to other communications standards. In the embodiment of FIG. 3, the electronic device 301 includes processing circuitry 305 that controls the overall operation of the electronic device 301 and also executes applications or "apps" 306 that provide specific functionality for a user of the electronic device 301. The electronic device 301 may be any type of electronic device, such as a smart phone, wearable electronic device like a heart rate or activity monitor, laptop or tablet computer, and so on. In the example embodiment of FIG. 3, the electronic device 301 includes a power management subsystem 308 coupled to the processing circuitry 2304 and would typically include a battery for powering the electronic device and also control circuitry for controlling power-related operating modes of the electronic device such as charging of the battery, power-savings modes, and so on.

The electronic device 301 further includes a video component such as a touch screen 310 with a touch display (not shown) such as a liquid crystal display (LCD) and a touch panel (not shown) attached to or formed as an integral part of the touch display. In operation, the touch screen 310 senses touches of a user of the electronic device 301 and provides sensed touch information to the processing circuitry 305 to thereby allow the user to interface with and control the operation of the electronic device. The processing circuitry 305 also controls the touch screen 310 to display desired visual content on the touch display portion of the touch screen.

The electronic device 301 further includes data storage or memory 312 coupled to the processing circuitry 305 for storing and retrieving data including the apps 306 and other software executing on the processing circuitry and utilized by the electronic device 301 during operation. Examples of typical types of memory 312 include solid state memory such as DRAM, SRAM and FLASH, solid state drives (SSDs), phase change RAM (PCRAM), and may include any other type of memory suited to the desired functionality of the electronic device 301.

Input devices 314 are coupled to the processing circuitry 305 and may include a keypad, whether implemented through the touch screen 310 or separately, a pressure sensor, accelerometer, microphone, keyboard, mouse, digital camera to capture still and video images, and other suitable input devices. Output devices 316 are coupled to the processing circuitry 305 and may include, for example, audio output devices such as a speaker, printer, vibration device, and so on. The communications subsystems 304 coupled to the processing circuitry 305 include suitable eUSB circuitry including the hybrid drivers 100, 200 in the example embodiment of FIG. 3, and also include other types of communication circuitry, such as Wi-Fi, GPS, cellular and Bluetooth circuitry for providing the electronic device 301 with the corresponding functionality. These other types of communication circuitry may also include the hybrid driver 100, 200. The specific type and number of input devices 314, output devices 316, communications subsystems 304, and even the specific functionality of the power management subsystem 308 will of course depend on the type of the electronic device 301, which may be any suitable type of electronic device.

Unless the context requires otherwise, throughout the specification and claims, the word "comprise" and variations thereof, such as, "comprises" and "comprising" are to be construed in an open, inclusive sense, that is as "including, but not limited to." In addition, reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It also should be noted that the term "or" is generally employed in its sense including "and/or" unless the content clearly dictates otherwise.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A hybrid driver, comprising:
 a high-speed differential driver circuit including a first transistor coupled between a first supply voltage node and first output node and a second transistor coupled between the first output node and a reference voltage node;
 a low-speed driver circuit including a third transistor coupled in parallel with the first transistor; and
 a logic circuit coupled to the high-speed differential driver circuit and the low-speed driver circuit, the logic circuit configured to receive first and second high-speed differential input signals, a first low-speed input signal, and a mode selection signal having a value indicating either a high-speed mode of operation or a low-speed mode of operation, and the logic circuit configured in response to the mode selection signal indicating the high-speed mode of operation to generate first control signals that activate and deactivate the first and second transistors responsive to the first and second high-speed differential input signals and that deactivate the third transistor, and the logic circuit configured in response to the mode selection signal indicating the low-speed mode of operation to generate second control signals to activate the second transistor responsive to the low-speed input signal having a first value and to activate the first and third transistors responsive to the low-speed input signal having a second value.

2. The hybrid driver of claim 1, wherein the first and second transistors comprise NMOS transistors and the third transistor is a single PMOS transistor.

3. The hybrid driver of claim 2, wherein the first supply voltage node is configured to receive a first supply voltage and wherein the logic circuit includes a second supply voltage node configured to receive a second supply voltage, the second supply voltage greater than the first supply voltage.

4. The hybrid driver of claim 3, wherein the logic circuit further comprises:
 a first inverting multiplexer having a first input configured to receive the first high-speed differential input signal, a second input configured to receive the first low-speed input signal, a control input configured to receive the mode selection signal, and an output;
 an inverter configured to receive the first low-speed input signal and having an output;

a second inverting multiplexer having a first input configured to receive the second high-speed differential input signal, a second input configured to receive the output of the inverter, a control input configured to receive the mode selection signal, and an output;

a first AND gate having a first input coupled to the output of the first inverting multiplexer, a second input configured to receive a slice selection signal, and an output coupled a control node of the second transistor; and a second AND gate having a first input coupled to the output of the second inverting multiplexer, a second input configured to receive the slice selection signal, and an output coupled a control node of the first transistor.

5. The hybrid driver of claim 4, wherein the low-speed driver circuit further comprises:

a pass gate having a first signal node coupled to the output of the first AND gate, a second signal node coupled to a control node of the third transistor, and a control node configured to receive a second selection signal; and a fourth transistor coupled between control node of the third transistor and the second supply voltage node, and having a control node configured to receive the second selection signal.

6. The hybrid driver of claim 5, wherein the fourth transistor comprises a PMOS transistor.

7. The hybrid driver of claim 1, wherein the high-speed differential driver circuit further comprises a first resistor coupled between the first transistor and the first supply voltage node and a second resistor coupled between the second transistor and the reference voltage node.

8. The hybrid driver of claim 1, wherein the first and second high-speed differential input signals comprise low voltage differential signals.

9. The hybrid driver of claim 8, wherein the low voltage differential signals comprise scalable low voltage signals.

10. The hybrid driver of claim 9, wherein the first low-speed input signal comprises a low voltage CMOS signal.

11. The hybrid driver of claim 10, wherein the scalable low voltage signals are 6 Gbps data signals and the low voltage CMOS signals is a 12 Mbps data signal.

12. A hybrid driver configured to receive a pair of high-speed differential input data signals and a pair of low-speed input data signals and configured to select one of the pairs of input data signals and to drive output data signals on first and second output nodes based on the selected pair of input data signals, the hybrid driver including first and second driver circuits coupled to the first and second output nodes, respectively, each of the first and second driver circuits including first and second series-connected transistors coupled between a supply voltage node and a reference voltage node, an interconnection of the first and second series-connected transistors coupled to the corresponding first or second output node, and each of the first and second driver circuits including a third transistor coupled in parallel with the first transistor, the third transistor configured to couple the corresponding first or second output node in parallel with the corresponding first transistor to a second supply voltage node in the response to the low-speed input data signals being selected and a value of the corresponding low-speed data signal.

13. The hybrid driver of claim 12, wherein each of the first and second series-connected transistors comprises an NMOS transistor and each of the third transistors comprises a single PMOS transistor.

14. The hybrid driver of claim 12, wherein the hybrid driver is configured to receive first and second selection signals and is configured to drive the first output node in response to the corresponding one of the pair of low-speed input data signals only when the mode selection signal is active and is configured to drive the second output node in response to the corresponding one of the pair of low-speed input data signals only when the second selection signal is active.

15. The hybrid driver of claim 12, wherein the pair of high-speed differential input data signals are low voltage differential signals and wherein the pair of low-speed input data signals are independent low voltage CMOS signals.

16. A method, comprising:

in a high-speed differential signaling mode of operation,
coupling a first output node through a first switching element to a first supply voltage node or through a second switching element to a reference voltage node in response to a first high-speed differential input signal; and coupling a second output node through a third switching element to the first supply voltage node or through a fourth switching element to the reference voltage node in response to a second high-speed differential input signal;

in a low-speed signaling mode of operation,
coupling the first output node in parallel through the first switching element and through a fifth switching element to a second supply voltage node or through the second switching element to the reference voltage node in response to a first low-speed input signal; and coupling the second output node in parallel through the third switching element and through a sixth switching element to the second supply voltage node or through the fourth switching element to the reference voltage node in response to a second low-speed input signal.

17. The method of claim 16, wherein the first and second high-speed differential input signals comprise low voltage differential signals.

18. The method of claim 17, wherein each of the first and second low-speed input signals comprises a low voltage CMOS signal.

19. The method of claim 16, the second supply voltage node receives a second supply voltage having a magnitude that is greater than a magnitude of a first supply voltage on the first supply voltage node.

20. The method of claim 19, wherein the magnitude of the first supply voltage is 400 millivolts and the magnitude of the second supply voltage is 1.2 volts.

* * * * *